United States Patent
Basol

(10) Patent No.: US 7,867,551 B2
(45) Date of Patent: Jan. 11, 2011

(54) PROCESSING METHOD FOR GROUP IBIIIAVIA SEMICONDUCTOR LAYER GROWTH

(75) Inventor: Bulent M. Basol, Manhattan Beach, CA (US)

(73) Assignee: SoloPower, Inc., San Jose, CA (US)

(*) Notice: Subject to any disclaimer, the term of this patent is extended or adjusted under 35 U.S.C. 154(b) by 636 days.

(21) Appl. No.: 11/859,706

(22) Filed: Sep. 21, 2007

(65) Prior Publication Data
US 2008/0210295 A1 Sep. 4, 2008

Related U.S. Application Data

(60) Provisional application No. 60/826,521, filed on Sep. 21, 2006.

(51) Int. Cl.
*B05D 5/12* (2006.01)
(52) U.S. Cl. .................. 427/74; 427/76; 427/443.2; 427/596; 136/252; 136/262; 136/264; 136/265; 438/505; 438/508; 438/565
(58) Field of Classification Search .............. 427/74, 427/76, 443.2, 596; 136/252, 262, 264, 265; 438/505, 508, 565
See application file for complete search history.

(56) References Cited

U.S. PATENT DOCUMENTS

| 4,581,108 | A | 4/1986 | Kapur et al. |
| 4,798,660 | A | 1/1989 | Ermer et al. |
| 5,626,688 | A | 5/1997 | Probst et al. |
| 6,048,442 | A | 4/2000 | Kushiya et al. |
| 6,092,669 | A | 7/2000 | Kushiya et al. |
| 6,541,695 | B1 * | 4/2003 | Mowles ............... 136/252 |
| 2005/0194036 | A1 * | 9/2005 | Basol ................... 136/252 |
| 2007/0266826 | A1 * | 11/2007 | Sanjurjo et al. ......... 75/367 |
| 2008/0053522 | A1 * | 3/2008 | Basol ................... 136/256 |

OTHER PUBLICATIONS

Guillemoles, J.F., "The puzzle of Cu(In,Ga)Se2 (CIGS) solar cells stability". Thin Solid Films 403-404 (2002), pp. 405-409.*
Rockett, A., "The effect of Na in polycrystalline and epitaxial single-crystal CuIn1-xGaxSe2". Thin Solid Films 480-481 (2005) pp. 2-7.*
Schock, Hans-Werner, et al., "CIGS-based Solar Cells for the Next Millennium". Progress in Photovoltaics: Research and Applications Prog. Photovolt. Res. Appl. 8, pp. 151-160 (2000).*
Friedfeld, R., et al., "Electrodeposition of CuInxGa1-xSe2 thin films". Solar Energy Materials & Solar Cells 58 (1999) pp. 375-385.*
Granath, et al., "Solar Energy Materials and Solar Cells", *Solar Energy Mats. & Solar Cells*, vol. 60, 2000, p. 279, 2000.
Rudmann, et al., "Sodium Incorporation Strategies for CIGS Growth at Different Temperatures", *Thin Solid Films*, vol. 431-432, 2005, pp. 55-60.

* cited by examiner

*Primary Examiner*—Bret Chen
(74) *Attorney, Agent, or Firm*—Pillsbury Winthrop Shaw Pittman LLP

(57) ABSTRACT

A method of forming a doped Group IBIIIAVIA absorber layer for solar cells by reacting a partially reacted precursor layer with a dopant structure. The precursor layer including Group IB, Group IIIA and Group VIA materials such as Cu, Ga, In and Se are deposited on a base and partially reacted. After the dopant structure is formed on the partially reacted precursor layer, the dopant structure and partially reacted precursor layer is fully reacted. The dopant structure includes a dopant material such as Na.

15 Claims, 2 Drawing Sheets

US 7,867,551 B2

PROCESSING METHOD FOR GROUP IBIIIAVIA SEMICONDUCTOR LAYER GROWTH

CLAIM OF PRIORITY

This application claims the benefit of U.S. Provisional Application Ser. No. 60/826,521 filed Sep. 21, 2006 entitled "Processing Method and Apparatus for Group IBIIIAVIA Semiconductor Layer Groups," which is incorporated herein by reference in its entirety.

FIELD OF THE INVENTION

The present invention relates to method and apparatus for preparing thin films of doped semiconductors for photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_y Se_{1-y})_k$, where $0 \leq x \leq 1$, $0 \leq y \leq 1$ and k is approximately 2, have already been employed in solar cell structures that yielded conversion efficiencies approaching 20%. Among the family of compounds, best efficiencies have been obtained for those containing both Ga and In, with a Ga amount in the 15-25%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical ohmic contact to the device. The stack of the substrate 11 and the conductive layer 13 forms a base 20. The most commonly used contact layer or conductive layer in the solar cell structure of FIG. 1 is Molybdenum (Mo). If the substrate itself is a properly selected conductive material such as a Mo foil, it is possible not to use a conductive layer 13, since the substrate 11 may then be used as the ohmic contact to the device. The conductive layer 13 may also act as a diffusion barrier in case the metallic foil is reactive. For example, metallic foils comprising materials such as Al, Ti, Ni, Cu may be used as substrates provided a barrier such as a Mo layer is deposited on them protecting them from Se or S vapors. The barrier is often deposited on both sides of the foil to protect it well. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized.

The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1. It should be noted that although the chemical formula of copper indium gallium sulfo-selenide is often written as $Cu(In,Ga)(S,Se)_2$, a more accurate formula for the compound is $Cu(In,Ga)(S,Se)_k$, where k is typically close to 2 but may not be exactly 2. For simplicity the value of k will be assumed as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique that yielded high-quality $Cu(In,Ga)Se_2$ films for solar cell fabrication was co-evaporation of Cu, In, Ga and Se onto a heated substrate in a vacuum chamber. This is an approach with low materials utilization and high cost of equipment.

Another technique for growing $Cu(In,Ga)(S,Se)_2$ type compound thin films for solar cell applications is a two-stage process where metallic components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer(s) and an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers.

One prior art method described in U.S. Pat. No. 4,581,108 utilizes a low cost electrodeposition approach for metallic precursor preparation. In this method a Cu layer is first electrodeposited on a substrate covered with Mo. This is then followed by electrodeposition of an In layer and heating of the deposited Cu/In stack in a reactive atmosphere containing Se to obtain CIS.

Prior investigations on possible dopants for Group IBIIIA-VIA compound layers have shown that alkali metals, such as Na, K, and Li, affect the structural and electrical properties of such layers. Especially, inclusion of Na in CIGS layers was shown to be beneficial for increasing the conversion efficiencies of solar cells fabricated on such layers provided that its concentration is well controlled. Inclusion of Na into CIGS layers was achieved by various ways. For example, Na was diffused into the CIGS layer from the substrate if the CIGS film was grown on a Mo contact layer deposited on a Na-containing soda-lime glass substrate. This approach, however, is hard to control and causes non-uniformities in the CIGS layers depending on how much Na diffuses from the substrate through the Mo contact layer. Therefore the amount of Na doping is a strong function of the nature of the Mo layer such as its grain size, crystalline structure, chemical composition, thickness, etc. In another approach (see for example, U.S. Pat. No. 5,626,688), a diffusion barrier is deposited on the soda-lime glass substrate to stop possible Na diffusion from the substrate into the absorber layer. A Mo contact film is then deposited on the diffusion barrier. An interfacial layer comprising Na is formed on the Mo surface. The CIGS film is then grown over the Na containing interfacial layer.

During the growth period, Na from the interfacial layer gets included into the CIGS layer and dopes it. The most commonly used interfacial layer material is NaF, which is evaporated on the Mo surface before the deposition of the CIGS layer by the co-evaporation technique (see, for example, Granath et al., Solar Energy Materials and Solar Cells, vol: 60, p: 279 (2000)). U.S. Pat. No. 7,018,858 describes a method of fabricating a layer of CIGS wherein an alkali layer is formed on the back electrode (typically Mo) by dipping the back electrode in an aqueous solution containing alkali metals, drying the layer, forming a precursor layer on the alkali layer and heat treating the precursor in a selenium atmosphere. Another method of supplying Na to the growing CIGS layer is depositing a Na-doped Mo layer on the substrate, following this by deposition of an un-doped Mo layer and growing the CIGS film over the undoped Mo layer. In this case Na from the Na-doped Mo layer diffuses through the undoped Mo layer and enters the CIGS film during high temperature growth.

It should be noted that the methods described above include the alkali metal early in the process and the alkali metal, such as Na, participates in the overall reaction as Cu, In, Ga and Se, optionally S react with each other forming the CIGS(S) compound film on the base. For example, a stack may be formed in accordance with prior art approaches where a Na-containing layer may first be deposited on a base comprising a Mo layer coated on a substrate. The Na-containing layer may be deposited on the Mo surface and then this may be followed by the deposition of a metallic precursor comprising Cu, In and Ga. When this stack is heated up in presence of Se to form a CIGS layer, all elements, i.e. Cu, In, Ga, Se and Na participate in this reaction. Same is true when Cu, In, Ga and Se are co-evaporated on a heated substrate surface covered by a Mo layer and a Na-containing layer. In these approaches, participation of the alkali, such as Na, in the reaction, may yield Na-containing phases such as Na-selenide (and/or Na-sulfide if S is present) compounds as alloys between Na and any one of Cu, In and Ga. The Na amount that is actually useful for doping, then needs to be experimentally determined since some Na is used for other reactions. Formation of excess phases such as Na—Se and or S may also reduce availability of Se and/or S to the actual CIGS(S) compound formation and thus cause problems with repeatability of the process as well as materials utilization. Sodium also influences the morphology and grain size of CIGS-type materials. Rudmann et al. (Thin Solid Films, vol: 431-432, p: 37, 2003), for example, observed a reduction in grain size of the CIGS films when Na was available during the growth of the compound layers.

As the review above demonstrates, controlled doping of Group IBIIIAVIA compound layers with alkali metals improve their quality in terms of yielding higher efficiency solar cell devices, however, there is still need for alternative methods to introduce the dopants into the compound layers in an efficient manner that does not negatively impact their morphological and electrical properties.

SUMMARY OF THE INVENTION

The present invention provides a process to introduce one or more dopant materials into absorbers used for manufacturing solar cells. In a first stage of the process, a precursor stack is prepared and partially reacted to have non-metallic phases in it. In a second stage, a dopant layer including a dopant material is formed on the partially reacted precursor. In a third stage, the partially reacted precursor layer is fully reacted in presence of the dopant material from the dopant layer to form an absorber layer.

In an aspect of the present invention, a multilayer structure to form absorber layers for solar cells is provided. The multilayer structure includes a base comprising a substrate layer, a partially reacted precursor layer formed on the base and a dopant layer on the partially reacted precursor layer. The dopant layer of the structure includes a Group IA material. The partially reacted precursor layer of the structure includes at least one of a non-metallic phase of Group IB-Group VIA material and a non-metallic phase of Group IIIA-Group VIA material. Accordingly, the Group IB material is Cu, Group IIIB material is at least one of In and Ga, Group VIA material is at least one of Se and S, and Group IA material includes one of Na, K and Li.

In another aspect of the present invention, a process of forming a doped Group IBIIIAVIA absorber layer on a base is provided. The process includes: depositing at least one Group IB and Group IIIA materials and VIA material on the base, forming a partially reacted precursor layer by partially reacting these materials, depositing a dopant-bearing film on this partially reacted precursor layer, and forming a doped absorber layer by fully reacting the partially reacted precursor layer in presence of dopant material from the dopant-bearing film. Here, the partial reaction of the at least one Group IB and Group IIIA materials with at least one Group VIA material results in a precursor layer having at least 50% non-metallic phase which includes at least one of a non-metallic phase of Group IB-Group VIA material and a non-metallic phase of Group IIIA-Group VIA material. The dopant-bearing film includes a dopant material having at least one of Na, K and Li.

DETAILED DESCRIPTION

The present invention provides a process to introduce one or more dopant materials into a precursor layer to manufacture absorber layers for solar cells. The process of the present invention generally includes three stages. In a first stage of the inventive process a primary structure such as a partially reacted precursor layer is initially prepared. The partially reacted precursor layer may be formed as a stack including layers of materials. In a second stage of the present invention, a secondary structure or a dopant layer, a dopant material with or without another material is formed on the partially reacted precursor layer. The primary and secondary structures together form a pre-absorber structure or pre-absorber stack. And, in a third stage, annealing of the pre-absorber structure forms a doped absorber layer or, in the art as often referred to as, a doped compound layer.

Figure 1:
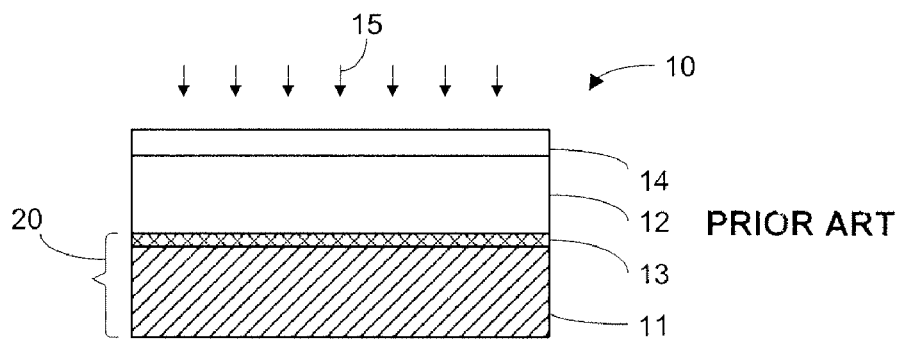
FIG. 1 is a cross-sectional view of a solar cell employing a Group IBIIIAVIA absorber layer.
Figure 2A:
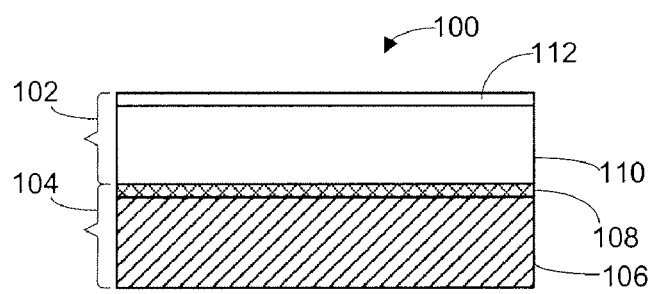
FIG. 2A is a schematic illustration of a pre-absorber structure of the present invention including a dopant layer formed on a partially reacted precursor layer.

As shown in FIG. 2A, in one embodiment, a multilayer stack 100 of the present invention includes a pre-absorber structure 102 formed on a base 104 including a substrate 106 and a contact layer 108. The pre-absorber structure 102 includes a partially reacted precursor layer 110 and a dopant-bearing film 112 which is formed on top of the partially reacted precursor layer 110. The dopant-bearing film 112 may be 2-100 nm thick, preferably 5-20 nm thick. In this embodiment, the partially reacted precursor layer 110 may be formed using a two-step process. During a first step, at least one Group IB and at least one Group IIIA material may be deposited on the base to form a metallic layer. For example, Cu, In and Ga metals are deposited on the base to form a metallic layer comprising Cu, In and Ga on the contact layer. The amounts of Cu, In and Ga metals may be adjusted to a desired composition. The desired composition may have a Cu/(In+Ga) molar ratio of 0.8-1.0 and a Ga/(In+Ga) molar ratio of 0.1-0.3. Various techniques such as electrodeposition, PVD, CVD, nano-particle deposition, ink deposition etc. may be employed to form the metallic layer. In the second step of the process, the partially reacted precursor layer 110 is formed on the dopant-free base 104 by reacting, preferably partially reacting, the metallic layer with at least one Group VIA material. Partial reaction means that the precursor layer is not converted to pure Group IBIIIAVIA compound such as a CIS, CGS or CIGS compound. For example, for CIGS growth, the precursor layer after the second stage does not contain only CIGS but may comprise several phases such as CIS, CGS, CIGS, Cu, In, Ga, Cu—In alloys or intermetallics, Cu—Ga alloys or intermetallics, Cu—Se phase, (In,Ga)Se phases, Cu—In—Ga phases, etc. For the purpose of this invention, out of these various phases, CIS, CGS, CIGS, Cu—Se, and (In,Ga)Se phases are considered non-metallic phases, whereas, Cu, In, Ga, Cu—In alloys, Cu—Ga alloys and Cu—In—Ga alloys are considered metallic phases.

The reaction of the metallic layer with the Group VIA material(s) may be achieved by various means. For example, a Group VIA material such as Se may be deposited on the metallic layer forming a stack and then the stack may be heated up in a furnace, in a Rapid Thermal Processing unit or laser annealing unit etc. Alternately the metallic layer may be exposed to heat and at the same time to a vapor (such as Se vapor) or gas (such as hydrogen selenide) comprising a Group VIA material. During the reaction, the temperature may be in the range of 250-550° C. and the reaction time may be in the range of 1-60 minutes. The phase composition of the partially reacted precursor layer after the second step of the process may be: (i) at least one of CuIn-selenide/sulfide, CuGa-selenide/sulfide and CuInGa-selenide/sulfide phases, and at least one of Cu-selenide/sulfide, In-selenide/sulfide, Ga-selenide/sulfide and InGa-selenide/sulfide phases, or, (ii) at least one of the Cu, In, Ga, Cu—In alloy, Cu—Ga alloy, Ga—In alloy and Cu—In—Ga alloy metallic phases and at least one of the Cu-selenide/sulfide, In-selenide/sulfide, Ga-selenide/sulfide, InGa-selenide/sulfide, CuIn-selenide/sulfide, CuGa-selenide/sulfide, CuInGa-selenide/sulfide non-metallic phases, or, (iii) at least two of the Cu-selenide/sulfide, In-selenide/sulfide, Ga-selenide/sulfide, and InGa-selenide/sulfide non-metallic phases.

If metallic and non-metallic phases are both present in the partially reacted precursor layer (such as case (ii) above), it is preferred that the non-metallic phases constitute more than 50% (molar), more preferably more than 80% of the chemical composition of the partially reacted precursor layer. It is important to have the partially reacted precursor layer to contain selenide and/or sulfide phases with well formed micro-structure.

Once it is formed on the base, at least one dopant-bearing film 112 is then provided on the partially reacted precursor layer 110 to complete the pre-absorber structure 102. The dopant material may be a Group IA material such as Na and the means of providing may comprise depositing a Na-bearing film on the surface of the partially reacted precursor layer 110. Depositing Na may be achieved by several techniques such as PVD, CVD, solution deposition, ink coating, dipping the partially reacted precursor layer into a Na-containing solution and drying etc. The Na-bearing film may be any film that has Na in its composition, such as Na-sulfide, selenide, chloride, fluoride etc.

Figure 2B:
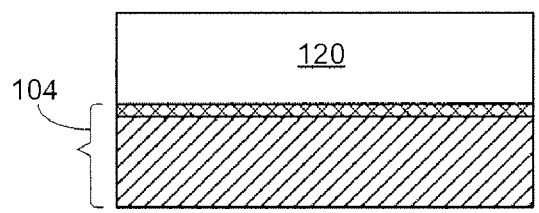
FIG. 2B is a schematic illustration of an absorber layer formed after reacting the pre-absorber structure shown in FIG. 2A.

As shown in FIG. 2B, once completed, the multilayer stack 100 is heated up, optionally in presence of additional Group VIA material species to transform the pre-absorber stack 102 into an absorber layer 120 comprising a doped Group IBIIIAVIA layer with large grain structure. During this reaction stage, the multilayer stack 100 may be annealed at a temperature range of 400-600° C. for a period of time of about 5-60 minutes, preferably 10-30 minutes. The heat initiates a reaction between constituents of the stack including the dopant and the partially reacted precursor layer. During this stage a pure Group IBIIIAVIA compound layer is formed and at the same time doped by the dopant. Preferably, additional Group VIA material(s) is supplied to the partially reacted precursor layer during the reaction step.

Figure 3:
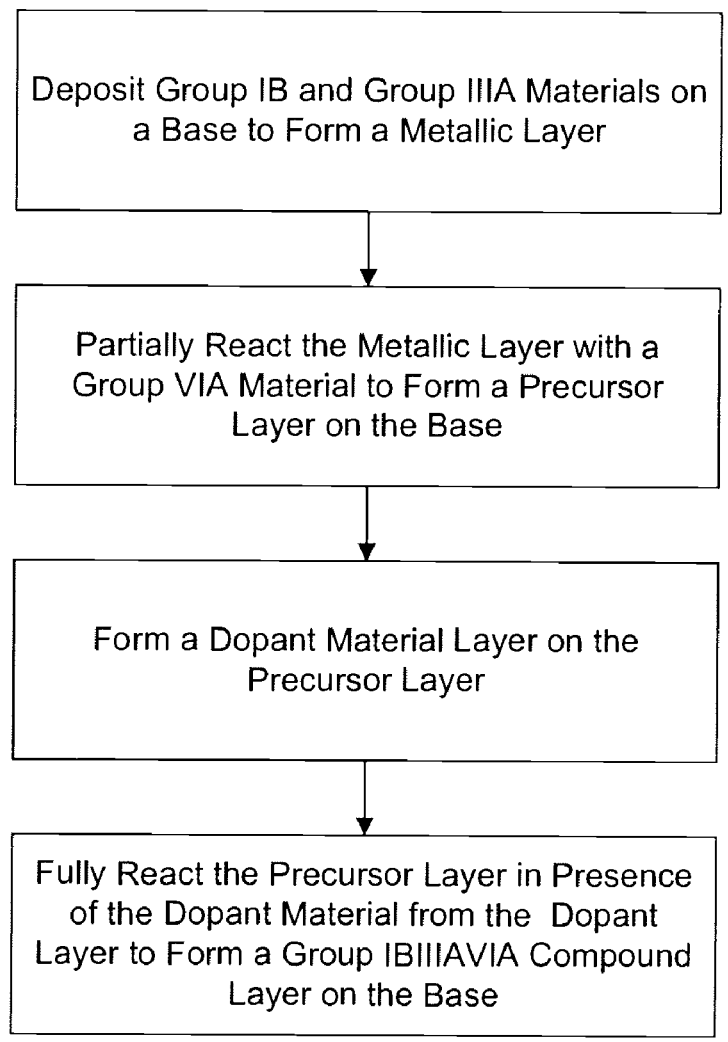
FIG. 3 shows a process flow chart in accordance with one embodiment of the present invention.

In the above example, the substrate may be a flexible metallic substrate such as a steel web substrate having a thickness of about 25-125 micrometers, preferably 50-75 micrometers. Similarly, the contact layer (Mo, W, Ru, Os or Ir, etc.) may be 200-1000 nm thick, preferably 300-500 nm thick. The above given precursor layers or stacks may have a thickness in the range of 400-1000 nm, preferably, 500-700 nm. The flow chart shown in FIG. 3 further exemplifies the process flow of the present invention described above.

Figure 4:
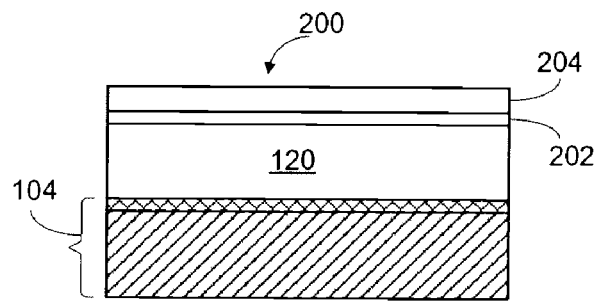
FIG. 4 is a schematic illustration of a solar cell manufactured using an embodiment of the present invention.

FIG. 4 shows a solar cell 200 formed by further processing of the above described absorber layer 120 shown in FIG. 2B. Solar cells may be fabricated on the absorber layers of the present invention using materials and methods well known in the field. For example a thin CdS layer 202 (<0.1 microns) may be deposited on the surface of the absorber layer 120 using the chemical dip method. A transparent window 204 of ZnO may be deposited over the CdS layer using MOCVD or sputtering techniques. A metallic finger pattern (not shown) is optionally deposited over the ZnO to complete the solar cell.

The invention will now be described through some examples utilizing electrodeposited Cu, In, Ga layers and Na as the dopant. It should be noted that the invention may be practiced using various other techniques for film depositions including approaches such as PVD, CVD, particle deposition, ink coating, electroless deposition etc. and various other dopants such as K, Li, Bi, P.

EXAMPLE 1

Na-Doped CIGS Film Formation

Cu, In and Ga layers are electrodeposited on a base forming a metallic layer. The base may comprise a substrate such as a foil or sheet substrate coated with a contact layer. In this case the base is substantially free of the dopant Na or barrier layers are provided within the base to avoid Na diffusion from the base into the CIGS layer being formed. The contact layer may comprise conductors such as Mo, W, Ta, Ti, Cr, Ru, Ir, Os etc., preferably Ru. Cu, In and Ga may be in the form of mixtures, alloys or discrete stacks with various structures such as Cu/Ga/In, Cu/In/Ga, Cu/Ga/Cu/In, Cu/In/Cu/Ga, etc. stacks. During the first reaction step of the process, Se and heat are provided to the metallic layer to initiate a reaction between Cu, In, Ga and Se. Selenium may be provided through a vapor source, such as Se vapor or a gas such as $H_2Se$, or Se solid may be deposited on the metallic layer by various methods such as PVD, electrodeposition, ink coating etc. The temperature may be in the range of 250-550° C. and the reaction time may be in the range of 1-60 minutes, longer times being utilized for lower reaction temperatures. The goal of the first reaction step is to provide partial reaction between the species of Cu, In, Ga and Se in absence of Na so that a partially reacted precursor layer with a first composition is formed with a first crystalline structure without interference from the dopant. This first composition may comprise at least one of the binary selenides of Cu, In and Ga and possibly a ternary phase of CIS and/or CGS and/or CIGS.

After the first reaction step a Na-containing layer is deposited on the partially reacted precursor layer with the first composition using various methods such as PVD, spraying, dipping, ink writing etc. This Na-containing layer may be a Na-fluoride, chloride, bromide, acetate, sulfide, selenide layer or any other layer that contains Na. The Na amount in the Na-containing layer may correspond to an amount that is 0.01-1% (atomic) of the final CIGS layer that is formed after the second reaction step which will be described. A second reaction step is then carried out where the partially reacted species of the precursor layer with the fist composition further react among themselves and possibly with externally supplied Se species in presence of Na provided by the Na-containing layer to form a CIGS layer that is doped with Na. If the Se amount provided during the first reaction step is adequate to form the stoichiometric CIGS layer there is no need to provide additional Se during the second reaction step. However, if this is not the case, it is preferable to provide additional Se to the growing layer during the second reaction step. It should be noted that although Na in this example is introduce through deposition of a Na-containing layer on the precursor layer with the first composition before the second reaction step, it is possible to introduce Na into the film during the second reaction step. In this case Na or Na-containing species may be provided from vapor phase during the second reaction step. The temperature during the second reaction step may be in the range of 400-600° C. and the reaction time may be in the range of 5-60 minutes, shorter reaction times corresponding to higher reaction temperatures.

EXAMPLE 2

Na-Doped CIGSS Film Formation

Cu, In and Ga layers are electrodeposited on a base forming a metallic layer. The base may comprise a substrate such as a foil or sheet substrate coated with a contact layer. In this case the base is substantially free of the dopant Na or barrier layers are provided within the base to avoid Na diffusion from the base into the CIGS layer being formed. The contact layer may comprise conductors such as Mo, W, Ta, Ti, Cr, Ru, Ir, Os etc., preferably Ru. Copper, In and Ga may be in the form of mixtures, alloys or discrete stacks with various structures such as Cu/Ga/In, Cu/In/Ga, Cu/Ga/Cu/In, Cu/In/Cu/Ga, etc. stacks. During the first reaction step of the process, Se and heat are provided to the metallic layer to initiate a reaction between Cu, In, Ga and Se. Selenium may be provided through a vapor source, such as Se vapor or a gas such as $H_2Se$, or Se solid may be deposited on the metallic layer by various methods such as PVD, electrodeposition, ink coating etc. The temperature may be in the range of 250-550° C. and the reaction time may be in the range of 1-60 minutes, longer times being utilized for lower reaction temperatures. The goal of the first reaction step is to provide partial reaction between the species of Cu, In, Ga and Se in absence of Na so that a partially reacted precursor layer with a first composition is formed with a first crystalline structure without interference from the dopant. This first composition may comprise at least one of the binary selenides of Cu, In and Ga and possibly a ternary phase of CIS and/or CGS and/or CIGS.

After the first reaction step a Na-containing layer is deposited on the partially reacted precursor layer using various methods such as PVD, spraying, dipping, ink writing etc. This Na-containing layer may be a Na-fluoride, chloride, bromide, acetate, sulfide, selenide layer or any other layer that contains Na. The Na amount in the Na-containing layer may correspond to an amount that is 0.01-1% (atomic) of the final CIGSS layer that is formed after the second reaction step. A second reaction step is then carried out where the partially reacted species of the partially reacted precursor layer with the first composition further react among themselves and with externally supplied S species in presence of Na to form a CIGSS layer that is doped with Na. Depending on the Se amount provided during the first reaction step the S and Se content in the final CIGSS layer may be controlled. It should be noted that although Na in this example is introduce through deposition of a Na-containing layer on the partially reacted precursor layer with the first composition before the second reaction step, it is possible to introduce Na into the film during the second reaction step. In this case Na or Na-containing species may be provided from vapor phase during the second reaction step. The temperature during the second reaction step may be in the range of 400-600° C. and the reaction time may be in the range of 5-60 minutes, shorter reaction times corresponding to higher reaction temperatures. Although Se is introduced into the metallic layer during the first reaction step in this example, it is also possible that S is introduced during the first reaction step forming a Cu—In—Ga—S precursor layer with the first composition and then Se is introduced during the second reaction step to form the doped CIGSS layer. It is also possible that S and Se are introduced together during the first and second reaction steps.

Although the present invention is described with respect to certain preferred embodiments, modifications thereto will be apparent to those skilled in the art.

The invention claimed is:

1. A process of forming a doped Group IBIIIAVIA absorber layer on a base, comprising:
   depositing at least one Group IB and Group IIIA and VIA material on the base;
   forming a partially reacted precursor layer by partially reacting the at least one Group IB and Group IIIA materials with at least one Group VIA material, wherein partially reacting the at least one Group IB and Group IIIA materials with at least one Group VIA material results in the partially reacted precursor layer having at least 50% non-metallic phase;
   depositing a dopant-bearing film on the partially reacted precursor layer, the dopant-bearing film comprising a dopant material including at least one of Na, K and Li; and
   fully reacting the partially reacted precursor layer with the dopant material from the dopant-bearing film to form the doped Group IBIIIAVIA absorber layer.

2. The process of claim 1, wherein the Group IB material is Cu, Group IIIA materials are In and Ga, and at least one Group VIA material comprises Se.

3. The process of claim 2 further comprising supplying a gaseous environment containing Se during the step of fully reacting.

4. The process of claim 2 further comprising supplying a gaseous environment containing S during the step of fully reacting.

5. The process of claim 2 further comprising supplying a gaseous environment containing S during the step of partially reacting.

6. The process of claim 2 further comprising supplying a gaseous environment containing S and Se during the step of fully reacting.

7. The process of claim 1, wherein the step of partially reacting comprises annealing at a temperature range of 250-550° C. for about 1-60 minutes.

8. The process of claim 1, wherein the step of fully reacting comprises annealing at a temperature range of 400-600° C. for about 5-60 minutes.

9. The process of claim 1, wherein the at least one Group IB, Group IIIA and Group VIA material comprise Cu, In, Ga and Se elements.

10. The process of claim 1, wherein the step of depositing the at least one Group IB, Group IIIA, and Group VIA material on the base comprises electroplating.

11. The process of claim 1, wherein the step of depositing the dopant-bearing film comprises dip coating the dopant material.

12. The process of claim 1, wherein the step of depositing the dopant-bearing film comprises vapor depositing the dopant material.

13. The process of claim 1, wherein the step of partially reacting the at least one Group IB and Group IIIA materials with at least one Group VIA material results in the partially reacted precursor layer having at least 80% non-metallic phase.

14. The process of claim 1, wherein the non-metallic phase comprises at least one of selenides and sulfides of Cu, In, Ga, CuIn, CuGa, InGa, and CuInGa.

15. The process of claim 13, wherein the non-metallic phase comprises at least one of selenides and sulfides of Cu, In, Ga, CuIn, CuGa, InGa, and CuInGa.

* * * * *